United States Patent [19]

Conzelmann et al.

[11] Patent Number: 5,298,462
[45] Date of Patent: Mar. 29, 1994

[54] METHOD OF MAKING METALLIZATION FOR SEMICONDUCTOR DEVICE

[75] Inventors: Gerhard Conzelmann, Leinfelden-Echterdingen; Karl Nagel, Gomaringen, both of Fed. Rep. of Germany

[73] Assignee: Robert Bosch GmbH, Stuttgart, Fed. Rep. of Germany

[21] Appl. No.: 756,833

[22] Filed: Sep. 9, 1991

Related U.S. Application Data

[63] Continuation-in-part of Ser. No. 691,067, Apr. 24, 1991, abandoned, which is a continuation of Ser. No. 282,931, Dec. 7, 1988, abandoned, which is a continuation of Ser. No. 120,212, Nov. 6, 1987, abandoned, which is a continuation of Ser. No. 857,742, Mar. 11, 1986, Pat. No. 5,205,243.

[30] Foreign Application Priority Data

Nov. 30, 1984 [DE] Fed. Rep. of Germany ....... 3443771

[51] Int. Cl.$^5$ ............................................. H01L 21/44
[52] U.S. Cl. ...................................... 437/187; 437/979
[58] Field of Search ...................... 437/187, 979

[56] References Cited

U.S. PATENT DOCUMENTS

| | | | |
|---|---|---|---|
| 3,920,484 | 11/1975 | Ogura et al. | 437/187 |
| 4,325,180 | 4/1982 | Curran | 437/187 |
| 4,362,574 | 12/1982 | Gevondyan | 437/187 |
| 4,377,900 | 3/1983 | Nonaka et al. | 437/187 |

*Primary Examiner*—Olik Chaudhuri
*Assistant Examiner*—Long Pham
*Attorney, Agent, or Firm*—Michael J. Striker

[57] ABSTRACT

In a semiconductor device including a semiconductor body, a continuous oxide layer, a continuous metallization layer, and a diffusion zone, the diffusion zone is located below a portion of the continuous oxide layer to reduce this portion in thickness, and the corresponding part of the metallization layer in the region of the oxide layer portion of reduced thickness forms an undulation which protects the metallization layer against thermal stresses.

5 Claims, 4 Drawing Sheets

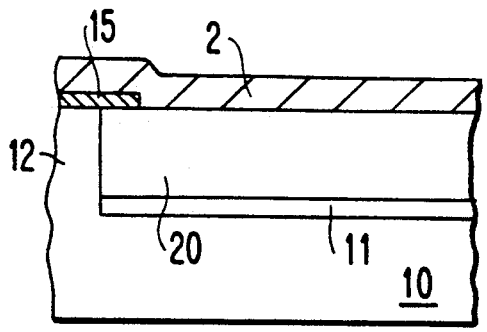 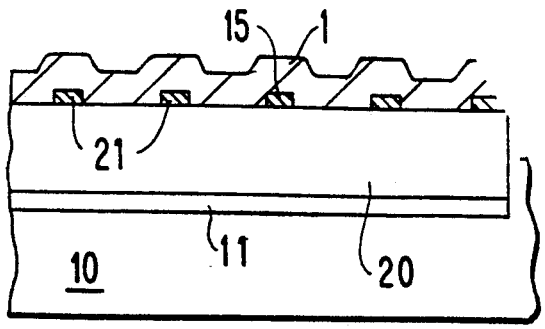
FIG. 4a  FIG. 4b
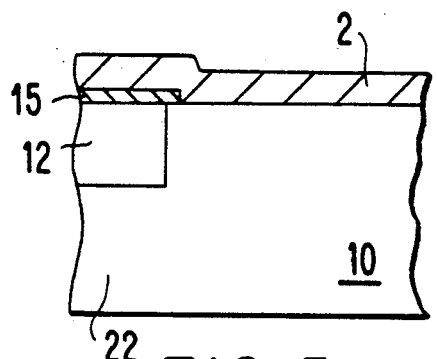 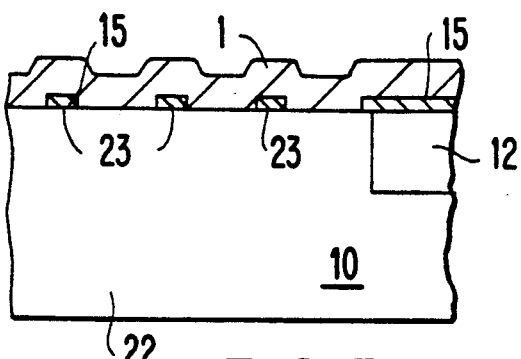
FIG. 5a  FIG. 5b
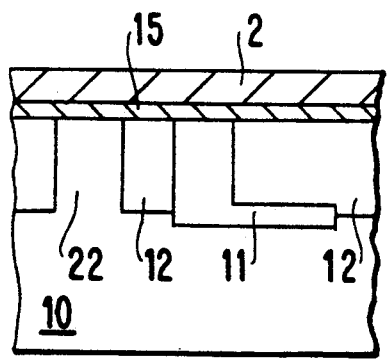 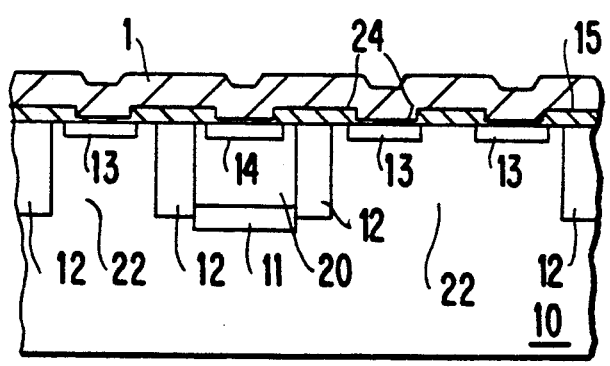
FIG. 6a  FIG. 6b

METHOD OF MAKING METALLIZATION FOR SEMICONDUCTOR DEVICE

CROSS-REFERENCE TO RELATED APPLICATIONS

This application is a continuation-in-part of patent application Ser. No. 691,067 on Apr. 24, 1991, now abandoned which is continuation of patent application Ser. No. 282,931 filed on Dec. 7, 1988 which is a continuation of patent application Ser. No. 120,212 filed on Nov. 6, 1987, now abandoned which is a continuation of patent application Ser. No. 857,742 filed on Mar. 11, 1986, now U.S. Pat. No. 5,205,243.

BACKGROUND OF THE INVENTION

The invention is based on a semiconductor device including a semiconductor body having on its upper surface at least one diffusion zone forming an electrode such as base-or emitter electrode of the device, a continuous oxide layer covering a part of the upper surface adjacent to the electrode diffusion zone, and a continuous metallized layer contacting the electrode diffusion zone and extending on the oxide layer to act as a conductor path.

Semiconductor devices, like ignition transistors, but also collecting circuits in integrated circuits which are subjected to high thermical shock stresses during testing and partially also during the practical operation show a disintegration of the metallization, after a period of time. Integrated collecting circuits for motor vehicles are mainly provided with collecting circuits so as to protect them against excess voltages of the power supply. These circuits require relative large faces and are designed up to the limits of their possible physical stressability. In frequent thermical shock stresses a destruction of the metallization occurs very often, whereby the metallization mainly consists of aluminum. Fine cracks can be noticed at certain distances in the metallization which interrupt the metallization at certain segments.

SUMMARY OF THE INVENTION

In keeping with these objects and with others which will become apparent hereinafter, one feature of the present invention resides, briefly stated, in a semiconductor device and a method of producing such a device, in accordance with which a semiconductor body is provided, a continuous oxide later is formed on the surface of the semiconductor body below a portion or portions of the oxide layer, and thereafter a metallization layer is applied on the oxide layer, so that in the region or regions of the oxide layer portion or portions of reduced thickness an undulation or undulations in the metallization layer are formed.

The semiconductor device in accordance with the invention is advantageous in that due to elevations and recesses in the area of the metallization crack formations can be eliminated, even with high thermical shock stresses. The elevations and recesses can be made in a simple manner in the form of oxide ribs or other oxide structures. The distances between the elevations and the recesses generated on the surface of the semiconductor device are smaller than the distances between cracks which occur in the metallization if no elevations and recesses are present. The metallizations or metallized layers which are applied on the structured surface has also corresponding elevations and recesses, so that this metallization is able to absorb higher mechanical tensions or shearing stresses. The mechanical tensions or shearing stresses occur during the heating of the system, since the longitudinal expansion coefficient of aluminum is five tunes as large as that of silicon. A high thermal shock resistance can be achieved in the area of the associated conductors by means of the elevations and recesses suggested by the invention. For example, a corresponding structuring may be provided in the area of the conductors which are disposed in the feed-in range of a highly loaded collection transistor of a semiconductor circuit which is connected with the power supply of a motor vehicle.

The surface structures may also be generated by different oxide thicknesses, whereby auxiliary diffusion zones are generated with a base, emitter or collector diffusion in the area of these surface structures. The type of the auxiliary diffusion is so selected that an electrically neutral diffusion is obtained which does not interfere with the operation of the semiconductor device.

A particular rational manufacturing of the desired structures is obtained in that the masking for etching a contact window is simultaneously used for etching the silicon in the area of the metallization.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIGS. 2a, 2b, 3a, 3b, 4a, 4b, 5a, 5b, 6a and 6b show a plurality of embodiments without (a) and with a structured surface (b) according to the invention in the area of metallizations.

DESCRIPTION OF THE PREFERRED EMBODIMENTS

Figure 1:
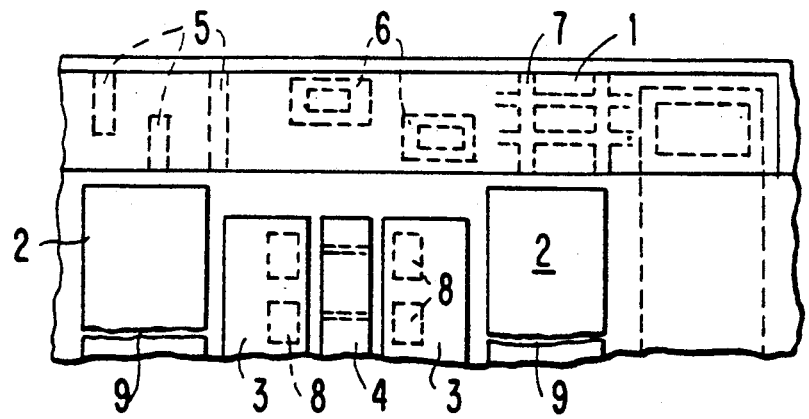
FIG. 1 is a sectional plan view of a semiconductor device.

The semiconductor device illustrated in FIG. 1 includes a plurality of metallizations or metallized layers 1, 2, 3 and 4 being shaped as conductors, wherein an elevated and recessed structuring of the surface is provided beneath metallization 1 only for increasing the thermal stressability. The contours of the elevations and recesses are illustrated with interrupted lines in FIG. 1. For example, ribs 5, depressed pits 6 or a lattice structure 7 may be provided for structuring the surface. The metallization 1 is applied on those elevations and recesses, so that at least approximately equidistant elevations and recesses are generated on the surface of the metallized layer 1.

In the semiconductor device illustrated in FIG. 1 there are adjacent emitter zones 8 which also generate a structuring of the surface. The desired high thermal shock resistance for the superposed metallization can also be obtained by a suitable segmentation of these emitter zones.

If metallizations 2 be subject to a high thermal stress, cracks 9 could be generated therein due to the omitted surface structure 5, 6, 7 or 8.

The exemplified embodiments illustrated in FIGS. 2a to 6b illustrate on the left side a known arrangement without a surface structure and on the right side the corresponding arrangement in accordance with the inventive structured or wavy surface.

Figure 2A:
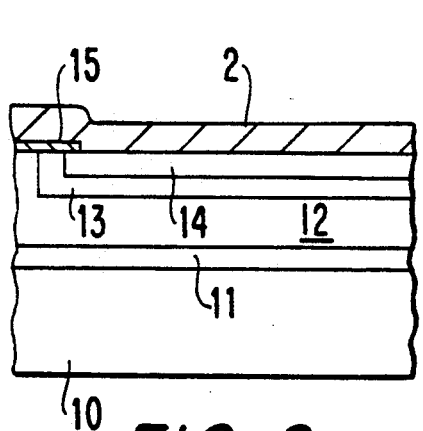
Figure 2B:
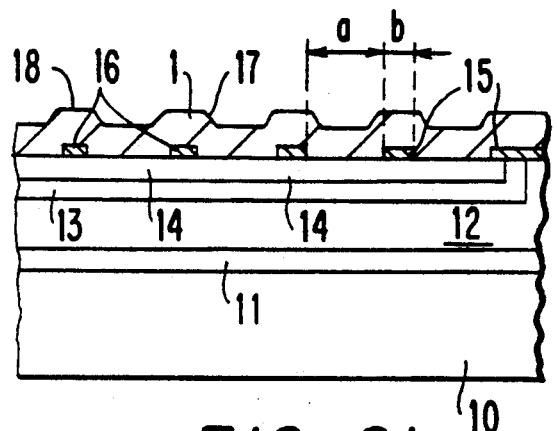

The devices illustrated in FIGS. 2a and 2b consist of a silicon-substrate 10, a buried-layer 11, an epitaxial layer 12 mounted thereon, a base-diffusion zone 13, an emitter diffusion zone 14, an oxide layer 15 covering the junction region between the base- and emitter diffusion zones, and a metallization 1 or 2 mounted on the oxide layer 15 and on the emitter diffusion zone 14. The metallization illustrated in FIG. 2a had been designated with reference numeral 2, corresponding to the non-structured metallization illustrated in FIG. 1. However, the metallization 1 illustrated in FIG. 2b is provided with a structuring which corresponds to the surface structure formed by a plurality of oxide ribs 16 on the semiconductor device. The recesses 17 and elevations 18 assure in conjunction with the structured surface beneath the metallization that no cracks are generated during the generated current shocks and the thermal shocks caused thereby in the area of the metallization 1.

In FIG. 2b the metallization 1 is disposed above the emitter diffusion zone 14 with which it is in contact while the oxide layer 15 insulates the metallization from the junction or barriers regions between the zones 13 and 14. The thickness fluctuation on the surface is obtained in such a manner that during free etching the emitter contact window, the oxide ribs 16 are created in this area due to structuring of the contact window mask. The width and the distance of these ribs can be easily made in such a manner that the emitter function is not interfered with, even with very high current densities in the emitter. For example, depending on the type of application, the rib widths b may be in a range of about 4 um. The distance between the ribs may be in a range of about 20–100 um. The thickness fluctuations are also in the um range and may be less than 1 um.

Figure 3A:
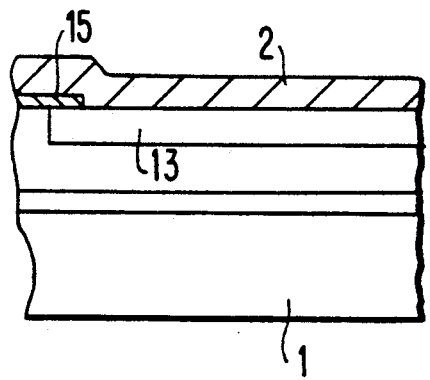
Figure 3B:
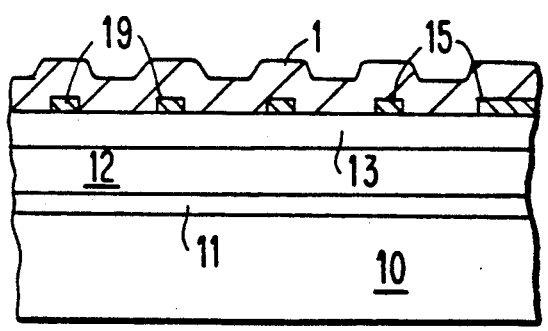

The metallizations 1, 2 in FIGS. 3a, 3b act as base-connection lines. Oxide ribs 19 are provided in FIG. 3b in the same manner as in FIG. 2b. In a combination of the devices in accordance with FIG. 2b and FIG. 3b it may be advantageous to arrange neighboring ribs 16 or 19 in an offset manner, thus providing staggered gaps therebetween.

FIGS. 4a and 4b illustrate devices with deep collector 20. Here too, a surface structuring in the range of the metallization 1 can be obtained by means of the succession of oxide ribs 21.

A corresponding structuring by means of suitable oxide structures, which are illustrated as oxide ribs 23, in the range of the insulation diffusion 22 of FIG. 5b. Since the insulation and deep collector diffusion are driven deeply into the substrate, small ribs may also be left standing in the diffusion window, depending on the method of manufacturing. Moreover, stages or step-like structures can be generated in the range of the base collector and/or insulation diffusion zones by means of an emitter-diffusion. In a corresponding manner this can be performed in the range of the insulation and deep collector-diffusion by means of a base-diffusion.

The metallizations 1, 2 are insulated against the silicon body by means of a continuous oxide layer 15 in FIGS. 6a and 6b. The successive, substantially equidistant regions of reduced thickness 24 in the contour of the oxide layer 15 as illustrated in FIG. 6b, generate a corresponding elevated and recessed structuring of the applied metallization 1. The regions of reduced thickness 24 can be made in that, auxiliary base diffusion zones 13' are provided in the areas above the insulating diffusion 22 and an auxiliary emitter diffusion zone 14' is provided in the deep collector 20. Emitter diffusion or eventually a base diffusion may be used in non-critical areas of the epitaxial layer 12.

In a corresponding manner the rear side of a semiconductor wafer or chip can be provided with a structuring by means of etching. This can be performed over the total wafer in a uniform structuring pattern. However, each chip may be provided with its own structuring.

The making of the elevations and recesses for producing a structured surface may be performed during the etching of the contact windows or by a separate photo lacquer and etching process. -,hereby the masking for etching the contact windows can also be used for etching the silicon.

FIGS. 7–10 show how during the production of the semiconductor device a structure or waviness of the metallization over the regions with the insulation diffusion is obtained by at least one auxiliary base diffusion zone 13'.

Figure 7:
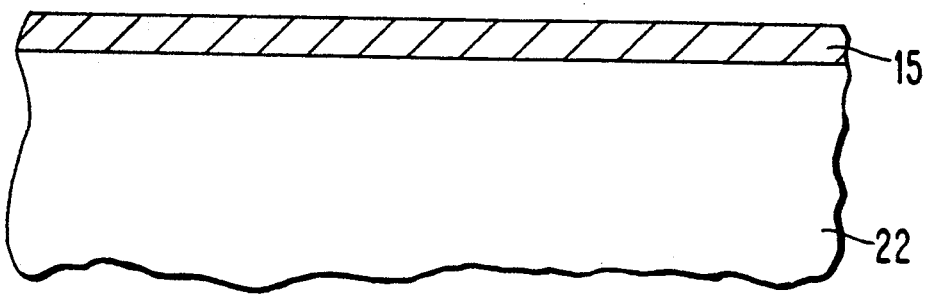
FIGS. 7-10 are views showing the production of the semiconductor device with the structured surface.
Figure 8:
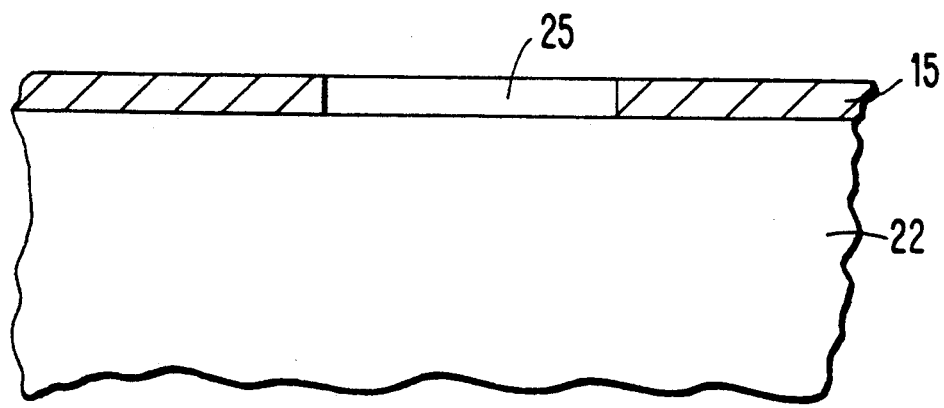
Figure 9:
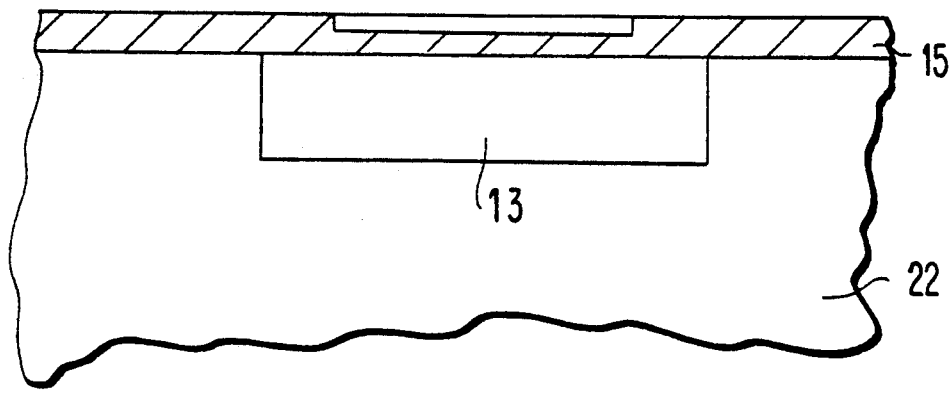

FIG. 7 shows a cross-section of the upper surface of the semiconductor body in a region, where an insulation diffusion zone 22 is arranged in the epitaxial layer 12. Such insulation diffusion zones 22 are also shown in FIGS. 5a, 5b, 6a, 6b. The throughgoing oxide layer 15 composed for example of silicum dioxide an(]having a predetermined thickness is located on the upper surface of the semiconductor body in the region of the insulation diffusion zone 22. The metallization arranged in this condition on the layer 15 has no structure or waviness. FIG. 8 shows the same cross-section of the semiconductor body as in FIG. 7, in which in the respective region with the insulation diffusion a hole 25 is etched in the oxide layer 15 by means of photo mask process. The hole 25 is provided for the diffusion in the auxiliary base diffusion zone 13' as shown in FIG. 9. The etching of the hole 25 is performed simultaneously with the opening of all windows of the integrated circuit which are provided for the base diffusion zones. Therefore, no additional step in the manufacturing process is required, but only a modification of the so-called base masks.

In FIG. 9 the same portion of the semiconductor body as in FIGS. 7 and 8, produced after the base diffusion zone has been diffused in the respective region with the insulation diffusion in the semiconductor body through the hole 25. Simultaneously with the formation of the auxiliary base diffusion zone 13', a silicium dioxide layer is formed inside the hole 25 on the free semiconductor surfaces. However, it has a smaller layer thickness than the region of the silicium dioxide layer located outside of the hole. Thereby the silicium dioxide layer 15 with a thickness step is produced, as identified with reference numeral 24 in FIG. 6b.

Figure 10:
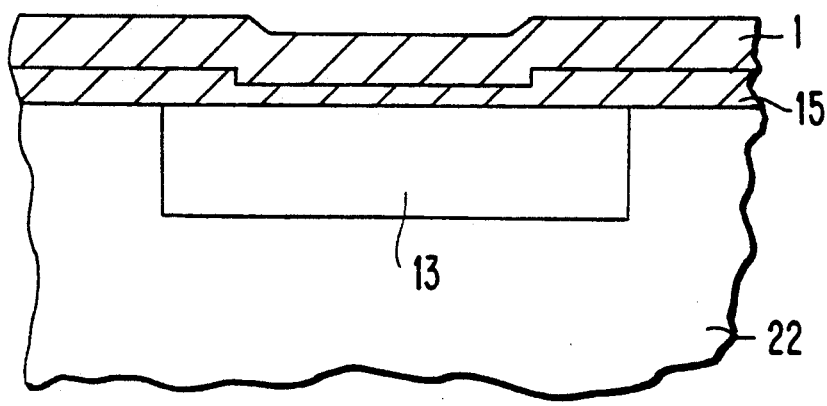

FIG. 10 shows the same section of the semiconductor body as in FIGS. 7–9, after the so-called contact metallization 11 is applied on the upper surface of the device. In the shown region with the insulation diffusion the contact metallization 1 is a component of a conductor path which must be insulated from the semiconductor surface. Due to the thickness step in the oxide layer 15 which is caused by the auxiliary base diffusion zone 13', the metallization layer 1 in this region is formed wavy.

It will be understood that each of the elements described above, or two or more together, may also find a useful application in other types of methods and constructions differing from the types described above.

While the invention has been illustrated and described as embodied in a semiconductor device and a method of producing the same, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A method of producing a semiconductor device, comprising of providing a semiconductor body; arranging a first continuous oxide layer on a surface of the semiconductor body; producing holes in said first oxide layer; applying diffusion zones and auxiliary diffusion zones in the semiconductor body through the holes by a diffusion process; coating the holes with a second oxide layer which is thinner than said first oxide layer in a diffusion process; forming contact openings in a part of the holes in the second oxide layer; applying a metallization so that at least one diffusion zone contacts with the metallization through the contact openings, so that holes with the auxiliary diffusion zone are arranged under a part of the metallization and a waviness of the metallization is thereby obtained by the auxiliary diffusion zones while the auxiliary diffusion zones do not perform electrical functions during an operation of the semiconductor device.

2. A method as defined in claim 1, wherein the auxiliary diffusion zone is formed by a base diffusion zone.

3. A method as defined in claim 2, wherein said semiconductor body includes an isolation diffusion zone, said auxiliary diffusion zone is arranged in said insulation diffusion zone.

4. A method as defined in claim 1, wherein said auxiliary diffusion zone is an emitter diffusion zone.

5. A method as defined in claim 1, wherein said semiconductor body has a collector diffusion zone, said auxiliary diffusion zone is arranged in said collector diffusion zone.

* * * * *